United States Patent
Kersey et al.

(10) Patent No.: US 7,508,608 B2
(45) Date of Patent: Mar. 24, 2009

(54) LITHOGRAPHICALLY FABRICATED HOLOGRAPHIC OPTICAL IDENTIFICATION ELEMENT

(75) Inventors: Alan D. Kersey, Glastonbury, CT (US); John A. Moon, San Diego, CA (US); Martin A. Putnam, Cheshire, CT (US)

(73) Assignee: Illumina, Inc., San Diego, CA (US)

( * ) Notice: Subject to any disclaimer, the term of this patent is extended or adjusted under 35 U.S.C. 154(b) by 122 days.

(21) Appl. No.: 11/283,518

(22) Filed: Nov. 17, 2005

(65) Prior Publication Data

US 2006/0132877 A1    Jun. 22, 2006

Related U.S. Application Data

(60) Provisional application No. 60/629,093, filed on Nov. 17, 2004.

(51) Int. Cl.
*G03H 1/00* (2006.01)
*H01L 21/00* (2006.01)

(52) U.S. Cl. .............. 359/900; 359/2; 438/32; 438/708

(58) Field of Classification Search ........... 359/900; 438/32

See application file for complete search history.

(56) References Cited

U.S. PATENT DOCUMENTS

| | | | |
|---|---|---|---|
| 3,891,302 A | 6/1975 | Dabby et al. | |
| 3,916,182 A | 10/1975 | Dabby et al. | |
| 3,968,476 A | 7/1976 | McMahon | |
| 4,011,435 A | 3/1977 | Phelps | |
| 4,023,010 A | 5/1977 | Horst et al. | |
| 4,053,228 A | 10/1977 | Schiller | |
| 4,053,433 A | 10/1977 | Lee | |
| 4,131,337 A | 12/1978 | Moraw et al. | |
| 4,168,146 A | 9/1979 | Grubb et al. | |
| 4,301,139 A | 11/1981 | Feingers et al. | |
| 4,386,274 A | 5/1983 | Altshuler | |
| 4,400,616 A | 8/1983 | Chevillat et al. | |
| 4,445,229 A | 4/1984 | Tasto et al. | |

(Continued)

FOREIGN PATENT DOCUMENTS

CH    598661 A    5/1978

(Continued)

OTHER PUBLICATIONS

Jain KK, Nanodiagnostics: application of nanotechnology in molecular diagnostics, Expert Review of Molecular Diagnostics 3(2):153-161 (2003), XP008038849.

(Continued)

*Primary Examiner*—Fayez G Assaf
(74) *Attorney, Agent, or Firm*—Small Patent Law Group; Dean D. Small

(57) ABSTRACT

A method for fabricating an optical identification element is provided, wherein a removable plate or substrate having photosensitive material fabricated thereon, one or more gratings are written on the photosensitive material, then lines are etched to create one or more separate optical identification elements. The one or more gratings may be written by exposing the photosensitive material to ultraviolet (UV) light. The lines may be etched to create the one or more separate optical identification elements by photolithography to define/create the same.

13 Claims, 2 Drawing Sheets

Partially Etched Substrate

Optical Arrangement for Fabricating Optical Identification Element

Optical Identification Element

U.S. PATENT DOCUMENTS

| | | |
|---|---|---|
| 4,447,546 A | 5/1984 | Hirschfeld |
| 4,537,504 A | 8/1985 | Baltes et al. |
| 4,560,881 A | 12/1985 | Briggs |
| 4,562,157 A | 12/1985 | Lowe et al. |
| 4,647,544 A | 3/1987 | Nicoli et al. |
| 4,678,752 A | 7/1987 | Thorne et al. |
| 4,685,480 A | 8/1987 | Eck |
| 4,690,907 A | 9/1987 | Hibino et al. |
| 4,701,754 A | 10/1987 | Provonchee |
| 4,716,121 A | 12/1987 | Block et al. |
| 4,725,110 A | 2/1988 | Glenn et al. |
| 4,740,468 A | 4/1988 | Weng et al. |
| 4,740,688 A | 4/1988 | Edwards |
| 4,748,110 A | 5/1988 | Paul |
| 4,762,420 A | 8/1988 | Bowley |
| 4,767,719 A | 8/1988 | Finlan |
| 4,807,950 A | 2/1989 | Glenn et al. |
| 4,816,659 A | 3/1989 | Bianco et al. |
| 4,822,746 A | 4/1989 | Walt |
| 4,841,140 A | 6/1989 | Sullivan et al. |
| 4,877,747 A | 10/1989 | Stewart |
| 4,880,752 A | 11/1989 | Keck et al. |
| 4,882,288 A | 11/1989 | North et al. |
| 4,921,805 A | 5/1990 | Gebeyehu et al. |
| 4,931,384 A | 6/1990 | Layton et al. |
| 4,937,048 A | 6/1990 | Sakai et al. |
| 4,958,376 A | 9/1990 | Leib |
| 4,992,385 A | 2/1991 | Godfrey |
| 5,002,867 A | 3/1991 | Macevicz |
| 5,003,600 A | 3/1991 | Deason et al. |
| RE33,581 E | 4/1991 | Nicoli et al. |
| 5,028,545 A | 7/1991 | Soini |
| 5,030,558 A | 7/1991 | Litman et al. |
| 5,033,826 A | 7/1991 | Kolner |
| 5,065,008 A | 11/1991 | Hakamata et al. |
| 5,067,155 A | 11/1991 | Bianco et al. |
| 5,081,012 A | 1/1992 | Flanagan et al. |
| 5,089,387 A | 2/1992 | Tsay et al. |
| 5,090,807 A | 2/1992 | Tai |
| 5,091,636 A | 2/1992 | Takada et al. |
| 5,095,194 A | 3/1992 | Barbanell |
| 5,100,238 A | 3/1992 | Nailor et al. |
| 5,104,209 A | 4/1992 | Hill et al. |
| 5,105,305 A | 4/1992 | Betzig et al. |
| 5,114,864 A | 5/1992 | Walt |
| 5,115,121 A | 5/1992 | Bianco et al. |
| 5,118,608 A | 6/1992 | Layton et al. |
| 5,129,974 A | 7/1992 | Aurenius |
| 5,138,468 A | 8/1992 | Barbanell |
| 5,141,848 A | 8/1992 | Donovan et al. |
| 5,143,853 A | 9/1992 | Walt |
| 5,144,461 A | 9/1992 | Horan |
| 5,160,701 A | 11/1992 | Brown, III et al. |
| 5,166,813 A | 11/1992 | Metz |
| 5,192,980 A | 3/1993 | Dixon et al. |
| 5,196,350 A | 3/1993 | Backman et al. |
| 5,200,794 A | 4/1993 | Nishiguma et al. |
| 5,218,594 A | 6/1993 | Tanno |
| 5,239,178 A | 8/1993 | Derndinger et al. |
| 5,244,636 A | 9/1993 | Walt et al. |
| 5,283,777 A | 2/1994 | Tanno et al. |
| 5,291,006 A | 3/1994 | Nishiguma et al. |
| 5,291,027 A | 3/1994 | Kita et al. |
| 5,300,764 A | 4/1994 | Hoshino et al. |
| 5,307,332 A | 4/1994 | Tinet |
| 5,310,686 A | 5/1994 | Sawyers et al. |
| 5,329,352 A | 7/1994 | Jacobsen |
| 5,342,790 A | 8/1994 | Levine et al. |
| 5,349,442 A | 9/1994 | Deason et al. |
| 5,352,582 A | 10/1994 | Lichtenwalter et al. |
| 5,364,797 A | 11/1994 | Olson et al. |
| 5,367,588 A | 11/1994 | Hill et al. |
| 5,372,783 A | 12/1994 | Lackie |
| 5,374,816 A | 12/1994 | Bianco |
| 5,374,818 A | 12/1994 | Bianco et al. |
| 5,388,173 A | 2/1995 | Glenn |
| 5,394,234 A | 2/1995 | Bianco et al. |
| 5,395,558 A | 3/1995 | Tsai |
| 5,426,297 A | 6/1995 | Dunphy et al. |
| 5,432,329 A | 7/1995 | O'Boyle et al. |
| 5,442,433 A | 8/1995 | Hoshino et al. |
| 5,448,659 A | 9/1995 | Tsutsui et al. |
| 5,451,528 A | 9/1995 | Raymoure et al. |
| 5,455,178 A | 10/1995 | Fattinger |
| 5,461,475 A | 10/1995 | Lerner et al. |
| 5,465,176 A | 11/1995 | Bianco et al. |
| 5,468,649 A | 11/1995 | Shah et al. |
| 5,506,674 A | 4/1996 | Inoue et al. |
| 5,514,785 A | 5/1996 | Van Ness et al. |
| 5,528,045 A | 6/1996 | Hoffman et al. |
| 5,547,849 A | 8/1996 | Baer et al. |
| 5,559,613 A | 9/1996 | Deveaud-Pledran et al. |
| 5,585,639 A | 12/1996 | Dorsel et al. |
| 5,587,832 A | 12/1996 | Krause |
| 5,607,188 A | 3/1997 | Bahns et al. |
| 5,610,287 A | 3/1997 | Nikiforov et al. |
| 5,620,853 A | 4/1997 | Smethers et al. |
| 5,621,515 A | 4/1997 | Hoshino |
| 5,624,850 A | 4/1997 | Kumar et al. |
| 5,625,472 A | 4/1997 | Mizrahi et al. |
| 5,627,040 A | 5/1997 | Bierre et al. |
| 5,627,663 A | 5/1997 | Horan et al. |
| 5,633,724 A | 5/1997 | King et al. |
| 5,633,790 A | 5/1997 | Gritter et al. |
| 5,633,975 A | 5/1997 | Gary et al. |
| 5,667,976 A | 9/1997 | Van Ness et al. |
| 5,671,308 A | 9/1997 | Inoue et al. |
| 5,682,244 A | 10/1997 | Barlow et al. |
| 5,712,912 A | 1/1998 | Tomko et al. |
| 5,721,435 A | 2/1998 | Troll |
| 5,729,365 A | 3/1998 | Sweatt |
| 5,736,330 A | 4/1998 | Fulton |
| 5,742,432 A | 4/1998 | Bianco |
| 5,745,615 A | 4/1998 | Atkins et al. |
| 5,745,617 A | 4/1998 | Starodubov et al. |
| 5,759,778 A | 6/1998 | Li et al. |
| 5,760,961 A | 6/1998 | Tompkin et al. |
| 5,766,956 A | 6/1998 | Groger et al. |
| 5,771,251 A | 6/1998 | Kringlebotn et al. |
| 5,776,694 A | 7/1998 | Sheiness et al. |
| 5,793,502 A | 8/1998 | Bianco et al. |
| 5,798,273 A | 8/1998 | Shuler et al. |
| 5,799,231 A | 8/1998 | Gates et al. |
| 5,801,857 A | 9/1998 | Heckenkamp et al. |
| 5,804,384 A | 9/1998 | Muller et al. |
| 5,812,272 A | 9/1998 | King et al. |
| 5,824,472 A | 10/1998 | Betlach et al. |
| 5,824,478 A | 10/1998 | Muller |
| 5,824,557 A | 10/1998 | Burke et al. |
| 5,830,622 A | 11/1998 | Canning et al. |
| 5,831,698 A | 11/1998 | Depp et al. |
| 5,837,475 A | 11/1998 | Dorsal et al. |
| 5,837,552 A | 11/1998 | Cotton et al. |
| 5,841,555 A | 11/1998 | Bianco et al. |
| 5,846,737 A | 12/1998 | Kang |
| 5,874,187 A | 2/1999 | Colvin et al. |
| 5,881,197 A | 3/1999 | Dong et al. |
| 5,895,750 A | 4/1999 | Mushahwar et al. |
| 5,922,550 A | 7/1999 | Everhart et al. |
| 5,922,617 A | 7/1999 | Wang et al. |
| 5,925,562 A | 7/1999 | Nova et al. |
| 5,925,878 A | 7/1999 | Challener |
| 5,945,679 A | 8/1999 | Dorsel et al. |
| 5,972,542 A | 10/1999 | Starodubov |

| | | | | | | |
|---|---|---|---|---|---|---|
| 5,976,896 | A | 11/1999 | Kumar et al. | 6,355,432 B1 | 3/2002 | Fodor et al. |
| 5,981,166 | A | 11/1999 | Mandecki | 6,356,681 B1 | 3/2002 | Chen et al. |
| 5,986,838 | A | 11/1999 | Thomas, III | 6,359,734 B1 | 3/2002 | Staub et al. |
| 5,989,923 | A | 11/1999 | Lowe et al. | 6,361,958 B1 | 3/2002 | Shieh et al. |
| 5,998,796 | A | 12/1999 | Liu et al. | 6,363,097 B1 | 3/2002 | Linke et al. |
| 6,001,510 | A | 12/1999 | Meng et al. | 6,371,370 B2 | 4/2002 | Sadler et al. |
| 6,005,691 | A | 12/1999 | Grot et al. | 6,372,428 B1 | 4/2002 | Nova et al. |
| 6,017,754 | A | 1/2000 | Chesnut et al. | 6,383,754 B1 | 5/2002 | Kaufman et al. |
| 6,025,129 | A | 2/2000 | Nova et al. | 6,391,562 B2 | 5/2002 | Kambara et al. |
| 6,025,283 | A | 2/2000 | Roberts | 6,395,558 B1 | 5/2002 | Duveneck et al. |
| 6,027,694 | A | 2/2000 | Boulton et al. | 6,399,295 B1 | 6/2002 | Kaylor et al. |
| 6,030,581 | A | 2/2000 | Virtanen | 6,399,935 B1 | 6/2002 | Jovin et al. |
| 6,035,082 | A | 3/2000 | Murphy et al. | 6,403,320 B1 | 6/2002 | Read et al. |
| 6,036,807 | A | 3/2000 | Brongers | 6,406,841 B1 | 6/2002 | Lee et al. |
| 6,043,880 | A | 3/2000 | Andrews et al. | 6,406,848 B1 | 6/2002 | Bridgham et al. |
| 6,046,925 | A | 4/2000 | Tsien et al. | 6,416,714 B1 | 7/2002 | Nova et al. |
| 6,049,727 | A | 4/2000 | Crothall | 6,416,952 B1 | 7/2002 | Pirrung et al. |
| 6,057,107 | A | 5/2000 | Fulton | 6,417,010 B1 | 7/2002 | Cargill et al. |
| 6,060,256 | A | 5/2000 | Everhart et al. | 6,428,707 B1 | 8/2002 | Berg et al. |
| 6,067,167 | A | 5/2000 | Atkinson et al. | 6,428,957 B1 | 8/2002 | Delenstarr |
| 6,067,392 | A | 5/2000 | Wakami et al. | 6,429,022 B1 | 8/2002 | Kunz et al. |
| 6,078,048 | A | 6/2000 | Stevens et al. | 6,433,849 B1 | 8/2002 | Lowe |
| 6,084,995 | A | 7/2000 | Clements et al. | 6,436,651 B1 | 8/2002 | Everhart et al. |
| 6,087,186 | A | 7/2000 | Cargill et al. | 6,440,667 B1 | 8/2002 | Fodor et al. |
| 6,096,496 | A | 8/2000 | Frankel et al. | 6,456,762 B1 | 9/2002 | Nishiki et al. |
| 6,096,596 | A | 8/2000 | Gonzalez | RE37,891 E | 10/2002 | Collins et al. |
| 6,097,485 | A | 8/2000 | Lievan | 6,462,770 B1 | 10/2002 | Cline et al. |
| 6,103,535 | A | 8/2000 | Pilevar et al. | 6,489,606 B1 | 12/2002 | Kersey et al. |
| 6,118,127 | A | 9/2000 | Liu et al. | 6,496,287 B1 | 12/2002 | Seiberle et al. |
| 6,128,077 | A | 10/2000 | Jovin et al. | 6,506,342 B1 | 1/2003 | Frankel |
| 6,137,931 | A | 10/2000 | Ishikawa et al. | 6,515,753 B2 | 2/2003 | Maher et al. |
| 6,143,247 | A | 11/2000 | Sheppard, Jr. et al. | 6,522,406 B1 | 2/2003 | Rovira et al. |
| 6,156,501 | A | 12/2000 | McGall et al. | 6,524,793 B1 | 2/2003 | Chandler et al. |
| 6,159,748 | A | 12/2000 | Hechinger | 6,533,183 B2 | 3/2003 | Aasmul et al. |
| 6,160,240 | A | 12/2000 | Momma et al. | 6,542,673 B1 | 4/2003 | Holter et al. |
| 6,160,656 | A | 12/2000 | Mossberg et al. | 6,544,739 B1 | 4/2003 | Fodor et al. |
| 6,164,548 | A | 12/2000 | Curiel | 6,545,758 B1 | 4/2003 | Sandstrom |
| 6,165,592 | A | 12/2000 | Berger et al. | 6,560,017 B1 | 5/2003 | Bianco |
| 6,165,648 | A | 12/2000 | Colvin et al. | 6,565,770 B1 | 5/2003 | Mayer et al. |
| 6,174,648 | B1 | 1/2001 | Terao et al. | 6,576,424 B2 | 6/2003 | Fodor et al. |
| 6,194,563 | B1 | 2/2001 | Cruickshank | 6,578,712 B2 | 6/2003 | Lawandy |
| 6,204,969 | B1 | 3/2001 | Jang | 6,592,036 B2 | 7/2003 | Sadler et al. |
| 6,214,560 | B1 | 4/2001 | Yguerabide et al. | 6,594,421 B1 | 7/2003 | Johnson et al. |
| 6,218,194 | B1 | 4/2001 | Lyndin et al. | 6,609,728 B1 | 8/2003 | Voerman et al. |
| 6,221,579 | B1 | 4/2001 | Everhart et al. | 6,613,581 B1 | 9/2003 | Wada et al. |
| 6,229,635 | B1 | 5/2001 | Wulf | 6,618,342 B1 | 9/2003 | Johnson et al. |
| 6,229,827 | B1 | 5/2001 | Fernald et al. | 6,622,916 B1 | 9/2003 | Bianco |
| 6,229,941 | B1 | 5/2001 | Yoon et al. | 6,628,439 B2 | 9/2003 | Shiozawa et al. |
| 6,242,056 | B1 | 6/2001 | Spencer et al. | 6,632,655 B1 | 10/2003 | Mehta et al. |
| 6,259,450 | B1 | 7/2001 | Chiabrera et al. | 6,635,470 B1 | 10/2003 | Vann |
| 6,268,128 | B1 | 7/2001 | Collins et al. | 6,635,863 B1 | 10/2003 | Nihommori et al. |
| 6,277,628 | B1 | 8/2001 | Johann et al. | 6,646,243 B2 | 11/2003 | Pirrung et al. |
| 6,284,459 | B1 | 9/2001 | Nova et al. | 6,657,758 B1 | 12/2003 | Garner |
| 6,285,806 | B1 | 9/2001 | Kersey et al. | 6,660,147 B1 | 12/2003 | Woudenberg et al. |
| 6,288,220 | B1 | 9/2001 | Kambara et al. | 6,678,429 B2 | 1/2004 | Mossberg et al. |
| 6,292,282 | B1 | 9/2001 | Mossberg et al. | RE38,430 E | 2/2004 | Rosenstein |
| 6,292,319 | B1 | 9/2001 | Thomas, III | 6,689,316 B1 | 2/2004 | Blyth et al. |
| 6,301,047 | B1 | 10/2001 | Hoshino et al. | 6,692,031 B2 | 2/2004 | McGrew |
| 6,304,263 | B1 | 10/2001 | Chiabrera et al. | 6,692,912 B1 | 2/2004 | Boles et al. |
| 6,306,587 | B1 | 10/2001 | Royer et al. | 6,874,639 B2 | 4/2005 | Lawandy |
| 6,309,601 | B1 | 10/2001 | Juncosa et al. | 6,881,789 B2 | 4/2005 | Bossé |
| 6,312,961 | B1 | 11/2001 | Voirin et al. | 6,892,001 B2 | 5/2005 | Ohta et al. |
| 6,313,771 | B1 | 11/2001 | Munroe et al. | 6,905,885 B2 | 6/2005 | Colston et al. |
| 6,314,220 | B1 | 11/2001 | Mossberg et al. | 6,908,737 B2 | 6/2005 | Ravkin et al. |
| 6,319,668 | B1 | 11/2001 | Nova et al. | 6,982,996 B1 | 1/2006 | Putnam et al. |
| 6,321,007 | B1 | 11/2001 | Sanders | 7,092,160 B2 | 8/2006 | Putnam et al. |
| 6,322,932 | B1 | 11/2001 | Colvin et al. | 7,106,513 B2 | 9/2006 | Moon et al. |
| RE37,473 | E | 12/2001 | Challener | 7,126,755 B2 | 10/2006 | Moon et al. |
| 6,329,963 | B1 | 12/2001 | Chiabrera et al. | 2001/0007775 A1 | 7/2001 | Seul et al. |
| 6,331,273 | B1 | 12/2001 | Nova et al. | 2002/0000471 A1 | 1/2002 | Aasmul et al. |
| 6,340,588 | B1 | 1/2002 | Nova et al. | 2002/0006664 A1 | 1/2002 | Sabatini |
| 6,352,854 | B1 | 3/2002 | Nova et al. | 2002/0018430 A1* | 2/2002 | Heckenkamp et al. ... 369/109.01 |
| 6,355,198 | B1 | 3/2002 | Kim et al. | 2002/0022273 A1 | 2/2002 | Empedocles et al. |

| | | | | | | |
|---|---|---|---|---|---|---|
| 2002/0025534 | A1 | 2/2002 | Goh et al. | GB | 2 306 484 | 5/1997 |
| 2002/0031783 | A1 | 3/2002 | Empedocles et al. | GB | 2 319 838 | 6/1998 |
| 2002/0034747 | A1 | 3/2002 | Bruchez et al. | GB | 2 372 100 | 8/2002 |
| 2002/0039732 | A1 | 4/2002 | Bruchez et al. | JP | 08102544 | 4/1986 |
| 2002/0074513 | A1 | 6/2002 | Abel et al. | JP | 01047950 | 2/1989 |
| 2002/0084329 | A1 | 7/2002 | Kaye et al. | JP | 10166075 | 6/1998 |
| 2002/0090650 | A1 | 7/2002 | Empedocles et al. | JP | 11-119029 | 4/1999 |
| 2002/0094528 | A1 | 7/2002 | Salafsky | JP | 2000-035521 | 2/2000 |
| 2002/0097658 | A1 | 7/2002 | Worthington et al. | JP | 00249706 | 9/2000 |
| 2002/0155490 | A1 | 10/2002 | Skinner et al. | WO | WO 91/06496 | 5/1991 |
| 2002/0197456 | A1 | 12/2002 | Pope | WO | WO 93/09668 | 5/1993 |
| 2003/0008323 | A1 | 1/2003 | Ravkin et al. | WO | WO 94/28119 | 12/1994 |
| 2003/0021003 | A1 | 1/2003 | Ono et al. | WO | WO 96/24061 | 8/1996 |
| 2003/0032203 | A1 | 2/2003 | Sabatini et al. | WO | WO 96/36436 A1 | 11/1996 |
| 2003/0077038 | A1 | 4/2003 | Murashima et al. | WO | WO 97/12680 | 4/1997 |
| 2003/0082568 | A1 | 5/2003 | Phan | WO | WO 97/15690 | 5/1997 |
| 2003/0082587 | A1 | 5/2003 | Seul et al. | WO | WO 97/17258 | 5/1997 |
| 2003/0129654 | A1 | 7/2003 | Ravkin et al. | WO | WO 97/31282 | 8/1997 |
| 2003/0138208 | A1 | 7/2003 | Pawlak et al. | WO | WO 97/34171 | 9/1997 |
| 2003/0142704 | A1 | 7/2003 | Lawandy | WO | WO 98/04740 | 2/1998 |
| 2003/0142713 | A1 | 7/2003 | Lawandy | WO | WO 98/24549 | 6/1998 |
| 2003/0153006 | A1 | 8/2003 | Washizu et al. | WO | WO 99/02266 | 1/1999 |
| 2003/0162296 | A1 | 8/2003 | Lawandy | WO | WO 99/09042 | 2/1999 |
| 2003/0184730 | A1 | 10/2003 | Price | WO | WO 99/32654 | 7/1999 |
| 2003/0203390 | A1 | 10/2003 | Kaye et al. | WO | WO 99/42209 | 8/1999 |
| 2003/0228610 | A1 | 12/2003 | Seul | WO | WO 00/08443 | 2/2000 |
| 2004/0047030 | A1 | 3/2004 | MacAuley | WO | WO 00/16893 A2 | 3/2000 |
| 2004/0075907 | A1 | 4/2004 | Moon et al. | WO | WO 00/37914 | 6/2000 |
| 2004/0100636 | A1 | 5/2004 | Somekh et al. | WO | WO 00/37969 | 6/2000 |
| 2004/0125370 | A1 | 7/2004 | Montagu | WO | WO 00/39617 | 7/2000 |
| 2004/0125424 | A1 | 7/2004 | Moon et al. | WO | WO 00/61198 | 10/2000 |
| 2004/0126875 | A1 | 7/2004 | Putnam et al. | WO | WO 01/58583 A1 | 8/2001 |
| 2004/0132205 | A1 | 7/2004 | Moon et al. | WO | WO 01/71322 A2 | 9/2001 |
| 2004/0170356 | A1 | 9/2004 | Iazikov et al. | WO | WO 01/78889 A2 | 10/2001 |
| 2004/0175842 | A1 | 9/2004 | Roitman et al. | WO | WO 01/90225 | 11/2001 |
| 2004/0209376 | A1 | 10/2004 | Natan et al. | WO | WO 02/059306 A2 | 8/2002 |
| 2004/0233485 | A1 | 11/2004 | Moon et al. | WO | WO-02/059306 A2 | 8/2002 |
| 2004/0263923 | A1 | 12/2004 | Moon et al. | WO | WO 03/061983 | 7/2003 |
| 2005/0042764 | A1 | 2/2005 | Sailor et al. | WO | WO 2004/019276 A1 | 3/2004 |
| 2005/0220408 | A1 | 10/2005 | Putnam | WO | WO 2004/024328 | 3/2004 |
| 2005/0227252 | A1 | 10/2005 | Moon et al. | WO | WO 2004/025561 | 3/2004 |
| 2005/0270603 | A1 | 12/2005 | Putnam et al. | WO | WO 2004/025562 | 3/2004 |
| 2006/0023310 | A1 | 2/2006 | Putnam et al. | WO | WO 2004/025563 A1 | 3/2004 |
| 2006/0028727 | A1 | 2/2006 | Moon et al. | WO | WO 2004/066210 | 8/2004 |
| 2006/0057729 | A1 | 3/2006 | Moon et al. | WO | WO 2005/026729 A3 | 3/2005 |
| 2006/0063271 | A1 | 3/2006 | Putnam et al. | WO | WO 2005/027031 A2 | 3/2005 |
| 2006/0071075 | A1 | 4/2006 | Moon et al. | WO | WO 2005/029047 A2 | 3/2005 |
| 2006/0072177 | A1 | 4/2006 | Putnam et al. | WO | WO 2005/033681 A1 | 4/2005 |
| 2006/0118630 | A1 | 6/2006 | Kersey et al. | WO | WO 2005/050207 A3 | 6/2005 |
| 2006/0119913 | A1 | 6/2006 | Moon | WO | WO 2005/079544 A2 | 9/2005 |
| 2006/0132877 | A1 | 6/2006 | Kersey | WO | WO 2006/020363 A2 | 2/2006 |
| 2006/0134324 | A1 | 6/2006 | Putnam et al. | WO | WO 2006/055735 A2 | 5/2006 |
| 2006/0139635 | A1 | 6/2006 | Kersey et al. | WO | WO 2006/055736 A1 | 5/2006 |
| 2006/0160208 | A1 | 7/2006 | Putnam et al. | WO | WO 2006/076053 A1 | 7/2006 |
| 2007/0121181 | A1 | 5/2007 | Moon et al. | | | |

FOREIGN PATENT DOCUMENTS

| | | |
|---|---|---|
| DE | 2416652 | 10/1975 |
| EP | 0 395 300 | 10/1990 |
| EP | 0 485 803 | 5/1992 |
| EP | 0 508 257 | 10/1992 |
| EP | 0 723 149 | 7/1996 |
| EP | 0 798 573 A1 | 10/1997 |
| EP | 0 911 667 A1 | 4/1999 |
| EP | 0 916 981 | 5/1999 |
| EP | 0 972 817 A1 | 1/2000 |
| EP | 1 182 054 A2 | 2/2002 |
| EP | 1 219 979 A1 | 7/2002 |
| GB | 2 118 189 | 10/1983 |
| GB | 2 129 551 | 5/1984 |
| GB | 2 138 821 | 10/1984 |
| GB | 2 299 235 | 9/1996 |

OTHER PUBLICATIONS

Othonos, X. Lee; Superimposed Multiple Bragg Gratings, Nov. 10, 1994, vol. 30, No. 23.

Po Ki Yuen, Microbarcode Sorting Device; Science & Technology, Corning Incorparated, Corning, New York 14831-0007, USA.

International Search Report and Preliminary Examination Report for International Application No. PCT/US2003/26315.

International Search Report and Written Opinion for International Application No. PCT/US2003/26316.

International Search Report for International Application No. PCT/US2003/28862.

International Search Report for International Application No. PCT/US2003/28874.

International Search Report for International Application No. PCT/US2003/28875.

International Search Report for International Application No. PCT/US2003/28887.

International Search Report for International Application No. PCT/US2003/28890.

International Search Report and Preliminary Examinatoin for International Application No. PCT/US2003/29164.

International Search Report for International Application No. PCT/US2003/29244.

International Search Report and Written Opinion for International Application No. PCT/US2004/01685.

International Search Report and Written Opinion for International Application No. PCT/US2004/30037.

International Search Report and Written Opinion for International Application No. PCT/US2004/30038.

International Search Report and Written Opinion for International Application No. PCT/US2004/30300.

International Search Report and Written Opinion for International Application No. PCT/US2004/32084.

International Search Report and Written Opinion for International Application No. PCT/US2004/38416.

International Search Report and Written Opinion for International Application No. PCT/US2005/05743.

International Search Report and Written Opinion for International Application No. PCT/US2005/05745.

International Search Report and Written Opinion for International Application No. PCT/US2005/26289.

International Search Report and Written Opinion for International Application No. PCT/US2005/33694.

International Search Report and Written Opinion for International Application No. PCT/US2005/41730.

International Search Report and Written Opinion for International Application No. PCT/US2005/41731.

Vander Lugt; "Design Relationships For Holographic Memories"; Applied Optics, vol. 12, No. 7, Jul. 1973; pp. 1675-1685.

Andrew Marshall; "DNA Chips: Array of Possibilities"; Nature Biotechnology vol. 16 Jan. 1998; pp. 27-31.

Thomas Laurell; "Enhanced Enzyme Activity in Silicon Integrated Enzyme Reactors Utilizing Porous Silicon as the Coupling Matrix"; Sensor & Actuators B 31 (1996); pp. 161-166.

Michael J. Kozal; "Extensive Polymorphisms Observed in HIV-1 Clade B Protease Gene Using High-Density Oligonucleotide Arrays"; Nature Medicine, vol. 2, No. 7, Jul. 1996; pp. 753-759.

Masato Mitsuhashi; "Gene Manipulation on Plastic Plates"; Nature, vol. 357, Jun. 11, 1992; pp. 519-520.

"Ben Beune Patent Licensing Director of Philips IP&S"; Replication & Duplication -News & Technology; Jan.-Feb. 2002; pp. 1-2.

"Compact Disc Arrayer"; V&P Scientific; Nov. 17, 2003; pp. 1-4.

De Beer et al., "Forward-Scattering Degenerate Four-Wave Mixing for Sensitive Absorption Detection in Microseparation Systems Coupling to Micro-Column Liquid Chromatography"; Journal of Chromatography A. 811 (1998); pp. 35-45.

Fonjallaz et al., "Interferometric Side Diffraction Technique for the Characterisation of Fiber Gratings"; 1999 OSA Conference, Sep. 23-25; 3 pgs.

Kogelnik H; "Coupled Wave Theory for Thick Hologram Gratings"; The Bell System Technical Journal, 48(9):2909-2947 (1969).

Krug P., "Measurement of Index Modulation Along an Optical Fiber Bragg Grating"; Optics Letters, 20(17):1767-1769.

Leith et al., "Holographic Data Storage in Three-Dimensional Media"; Applied Optics, vol. 5, No. 8, Aug. 1966; 21 pgs.

Shelia R. Nicerwarner-Peña, "Submicrometer Metallic Barcodes"; Science, vol. 294; Oct. 5, 2001; 5 pgs.

Ivan Oransky; "Sequencing on Compact Disc? Microgenomics of Breast Cancer; Better Binding Site Prediction"; vol. 17 / Issue 13 / 35 / Jun. 30, 2003; 13 pgs.

Mark O. Worthington; "Curriculum Vitae"; Jan. 5, 2004; 4 pgs.

Yoshinobu Kohara; "DNA Probes on Beads Arrayed in a Capillary, 'Bead-Array',Exhibited High Hybridization Performance"; Nucleic Acids Research, 2002, vol. 30, No. 16 e87; 7 pgs.

"Electronically Scanned Confocal Imaging System"; IBM Technical Disclosure Bulletin; vol. 36; No. 06B; Jun. 1993; pp. 261-262.

Hideki Kambara; Recent Progress In fluorescent DNA Analyzers and Methods; Current Topics in Analytical checmistry; vol. 1, (1998) pp. 21-36.

G. Kakarantzas et al.;"Transmission Filters Based on periodically Micro-tapered Fibre"; CLE0/2000/Friday Morning; 8:45 a.m.; pp. 574-575.

Michael C. Needels et al.; "Generation and Screening of an Oligonucleotide-Encoded Synthetic Peptide Library"; Proc Natl. Acad. Sci. USA, vol. 90;pp. 10700-10704, Nov. 1993.

W.R. Rigby; "An Anodizing Process for the Production of Inorganic Microfiltration Membranes"; 2436Transactions of the Institute of Metal Finishing;68(1990)Aug.,Part 3 p. 95-98.

Patil et al., "Porous Polysterene Beads as Carriers for Self-Emulsifying System Containing Loratadine"; AAPS PharmSciTech, Mar. 24, 2006, vol. 7, pp. E1-E7.

Lide, "CRC Handbook of Chemistry and Physics", 71st Ed., CRC Press, Inc., Boca Raton, FL, 1990, 10 pgs.

"Introduction to Flow Cytometry: A Learning Guide", BD Biosciences, San Jose, CA, Apr. 2000.

* cited by examiner

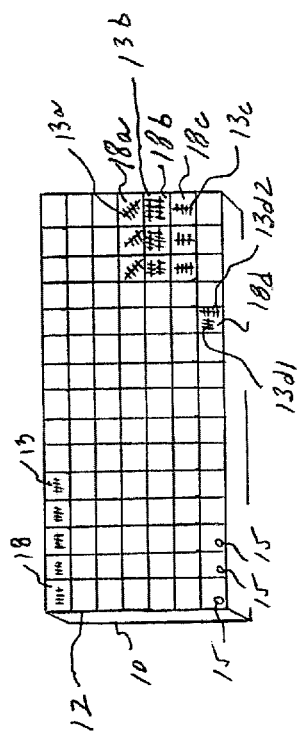
Figure 2: Partially Etched Substrate
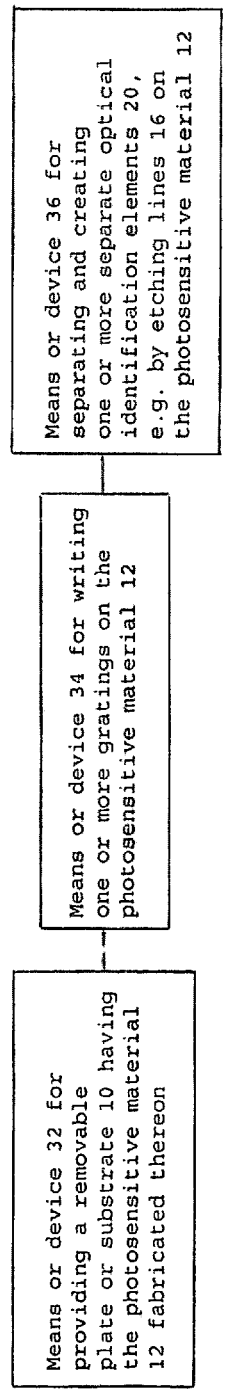
Figure 3: Optical Arrangement for Fabricating Optical Identification Element
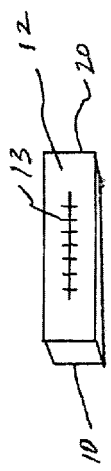
Figure 4: Optical Identification Element ically fabricated holographic optical identification element itself.

LITHOGRAPHICALLY FABRICATED HOLOGRAPHIC OPTICAL IDENTIFICATION ELEMENT

CROSS REFERENCES TO RELATED APPLICATIONS

This application claims benefit to U.S. provisional patent application No. 60/629,093, filed Nov. 17, 2004, which is hereby incorporated by reference in their entirety.

The following cases contain subject matter related to that disclosed herein and are incorporated herein by reference in their entirety: U.S. patent application Ser. No. 10/661,234, filed Sep. 12, 2003, entitled "Diffraction Grating-Based Optical Identification Element"; U.S. patent application Ser. No. 10/661,031 filed Sep. 12, 2003, entitled "Diffraction Grating-Based Encoded Micro-particles for Multiplexed Experiments"; U.S. patent application Ser. No. 10/661,082, filed Sep. 12, 2003, entitled "Method and Apparatus for Labeling Using Diffraction Grating-Based Encoded Optical Identification Elements"; U.S. Patent Application Serial No. 10/661,115, filed Sep. 12, 2003, entitled "Assay Stick"; U.S. patent application Ser. No. 10/661,836, filed Sep. 12, 2003, entitled "Method and Apparatus for Aligning Microbeads in order to Interrogate the Same"; U.S. Patent application Ser. No. 10/661,254, filed Sep. 12, 2003, entitled "Chemical Synthesis Using Diffraction Grating-based Encoded Optical Elements"; U.S. patent application Ser. No. 10/661,116, filed Sep. 12, 2003, entitled "Method of Manufacturing of a Diffraction grating-based identification Element"; and U.S. patent application Ser. No. 10/763,995, filed Jan. 22, 2004, entitled, "Hybrid Random Bead/Chip Based Microarray", US Provisional Patent Applications Ser. Nos. 60/609,583, 60/610,059 and 60/609,712, all filed Sep. 13, 2004; U.S. Provisional Patent Applications Ser. Nos. 60/611,205, 60/610,910, 60/610,833, 60/610,829, 60/610,928, all filed Sep. 17, 2004; U.S. Provisional Patent Application Ser. No. 60/611,676, filed Sep. 20, 2004; and U.S. patent applications Ser. No. 10/956,791, filed Oct. 1, 2004.

BACKGROUND OF INVENTION

1. Technical Field

The present invention relates to a method and apparatus for fabricating an optical identification element; and more particularly to a method and apparatus for fabricating a holographic optical identification element using a lithographic technique, as well as the holographic optical identification element itself.

SUMMARY OF INVENTION

The present invention provides a new and unique method for fabricating an optical identification element, wherein a removable plate or substrate having a photosensitive material fabricated on is provided, one or more gratings are written on the photosensitive material, then lines are etched to create one or more separate optical identification elements.

The one or more gratings may be written by exposing the photosensitive material to ultraviolet (UV) light.

The lines may be etched to create the one or more separate optical identification elements by photolithography to define/create the same.

The one or more separate optical identification element are planar elements.

The optical identification element may take the form of a holographic optical identification element having one of the following geometric shapes, such as a plate, a bar, a brick, a disc, a slab, etc.

The method according to the present invention enables many possible options, geometries, sizes, photosensitive materials in relation to the overall fabrication of an optical identification element.

The present invention also includes the possibly of using a surface relief grating, a densification grating, cover slips, or borosilcate.

The scope of the invention is also intended to include the apparatus for fabricating an optical identification element consistent with the description of the aforementioned method, including a combination of devices for performing the steps described above, as well as an optical identification element that results from the steps of the method or process shown and described herein.

One advantage of the present invention is that conventional technology may be used to fabricate an optical identification element with a high level of flexibility.

In effect, the present invention potentially adds a whole new dimension to existing biochip technology.

BRIEF DESCRIPTION OF THE DRAWING

The drawing, which is not drawn to scale, includes the following:

FIG. 2 is a diagram of a partially etched substrate according to the present invention.

FIG. 3 is a block diagram of an optical arrangement for fabricating an optical identification element according to the present invention.

FIG. 4 is a diagram of an optical identification element according to the present invention.

DETAILED DESCRIPTION OF THE INVENTION

Figure 1:
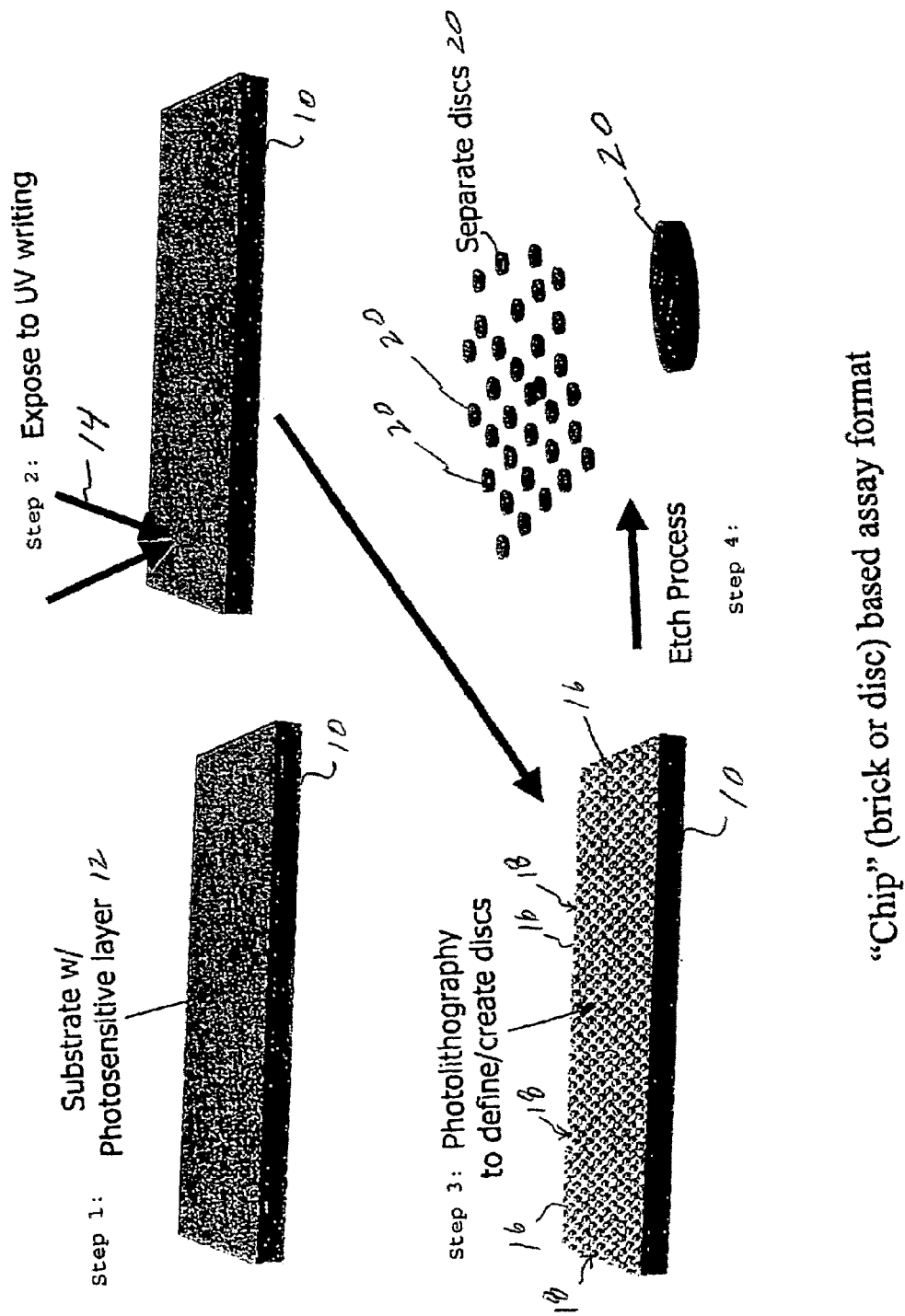
FIG. 1 is a diagram of steps for fabricating a optical identification element according to the present invention.

FIG. 1 shows steps 1-4 for performing a method for fabricating an optical identification element 20 (see also FIG. 4) according to the present invention.

In step 1, a removable plate or substrate 10 having a photosensitive material 10 fabricated thereon. Suitable photosensitive materials are known in the art, and the scope of the invention is not intended to be limited to any particular kind either now known or later developed in the future. The plate or substrate 10 may take the form of many different medium or material, including, but not limited to, an optical medium or material, although the scope of the invention is also intended to include other materials for the substrate now known or later developed in the future.

In step 2, one or more gratings 13 (best shown in FIGS. 2 and 4) are written on the photosensitive material 12, for example, by exposing the photosensitive material 12 to ultraviolet (UV) light 14, although the scope of the invention is also intended to include using other grating writing techniques either now known or later developed in the future.

In step 3, one or more lines 16 are etched or formed to create and form one or more separate optical identification elements that are generally indicated as 18 in FIG. 1 using photolithography to define/create the same, although the scope of the invention is also intended to include using other etching techniques either now known or later developed in the future.

In step 4, the etching process in step 3 results in the formation of the one or more separate optical identification elements 20. In this case, the elements 18 are removed or separated from the substrate 10 by the etching process. Alternatively, the elements 18 may be removed or separated from the substrate 10 by exposing them in a suitable solution and form the one or more optical identification elements 20. Such a suitable solution is known in the art, and the scope of the invention is not intended to be limited to any particular type or kind thereof. The one or more separate optical identification element 20 take the form of planar elements, as distinguished from optical fiber, optical filaments, or the like that are known in the art.

Moreover, the scope of the invention is intended to include the optical identification element 20 taking the form of a holographic optical identification element or other suitable optical identification element having an interference pattern reproduced from a pattern of interference produced by a split coherent beam of radiation (as a laser) either now known or later developed in the future, or by any of the techniques described in copending U.S. patent application CV-0038A or CV-0044, and other related cases referenced herein. Moreover, the optical identification elements 20 may take the geometric form of one or more planar objects, including plates, bars, bricks, discs, slabs, chips, or other suitable planar geometric shape and/or dimensionality now known or later developed in the future, including those described in CV-0038A and other patent applications referenced herein.

Alternative Technique

The present invention also provides an alternative format micro "chip" assay technique relating to code reading via embedded collocated gratings, as follows:

Grating Orientation:

The scope of the invention is intended to include at least the following grating orientation techniques shown by way of example in FIG. 2:

1) Writing grating codes 13a, 13b, 13c, 13d1, 13d2 at multiple axes across each disc or element 18—where a single axis reader always may be used to pick up one code.

2) Adding orientation 'marker' 15 to one or more discs or elements 18, such as by adding one or more of the following:
   a) Magnetic material for self-alignment;
   b) Birefringence; or
   c) Fluorescence to determine alignment/orientation. 3) Putting each "bit" in along a different axis and use a spinning readout system (e.g. each bit assessed).

The Optical Arrangement or Apparatus

The scope of the invention is also intended to include an optical arrangement or apparatus for fabricating an optical identification element consistent with the description of the aforementioned method, including a combination of devices for performing the steps described above. For example, FIG. 3 shows the optical arrangement or apparatus generally indicated as 30 for fabricating such an optical identification element 20, including the combination of a means or device 32 for providing a removable plate or substrate 10 having the photosensitive material 12 fabricated thereon; a means or device 34 for writing one or more gratings 13, 13a, 13b, 13c, 13d1, 13d2 (see FIG. 2) on the photosensitive material 12; and a means or device 36 for separating and creating the one or more separate optical identification elements 20, including by, e.g., etching the lines 16 on the photosensitive material 12.

The Optical Identification Element 20

FIG. 4 shows, by way of example, the optical identification element 20 in greater detail that results from the steps of the method or process shown in FIG. 1, and/or the optical arrangement shown in FIG. 3. The scope of the invention is also intended to include the optical identification element itself made by the method or process set forth above, including, but not limited to, a holographic optical identification element made from the lithographic technique described herein. The present invention may be used to create the encoded elements consistent with that described in copending U.S. patent application Ser. No. 10/661,234, filed 12 Sep. 2003 (CyVera Docket No. CV-0038A) and the other patent applications referenced herein, which are incorporated herein by reference in their entirety.

Applications, Uses, Geometries and Embodiments for the Encoded Element of the Present Invention Applications, uses, geometries and embodiments for the encoded element of the present invention may be the same as that described in the following cases which are all incorporated herein by reference in their entirety: U.S. patent application Ser. No. 10/661,234 (CyVera Docket No. CV-0038A), filed Sep. 12, 2003, entitled "Diffraction Grating-Based Optical Identification Element"; U.S. patent application Ser. No. 10/661,031 (CyVera Docket No. CV-0039A) filed Sep. 12, 2003, entitled "Diffraction Grating-Based Encoded Microparticles for Multiplexed Experiments"; U.S. patent application Ser. No. 10/661,082 (CyVera Docket No. CV-0040), filed Sep. 12, 2003, entitled "Method and Apparatus for Labeling Using Diffraction Grating-Based Encoded Optical Identification Elements"; U.S. patent application Ser. No. 10/661,115 (CyVera Docket No. CC-0041), filed Sep. 12, 2003, entitled "Assay Stick"; U.S. patent application Ser. No. 10/661,836 (CyVera Docket No. CV-0042), filed Sep. 12, 2003, entitled "Method and Apparatus for Aligning Microbeads in order to Interrogate the Same"; U.S. patent application Ser. No. 10/661,254 (CyVera Docket No. CV-0043), filed Sep. 12, 2003, entitled "Chemical Synthesis Using Diffraction Grating-based Encoded Optical Elements"; U.S. patent application Ser. No. 10/661,116 (CyVera Docket No. CV-0044), filed Sep. 12, 2003, entitled "Method of Manufacturing of a Diffraction grating-based identification Element"; and U.S. patent application Ser. No. 10/763,995 (CyVera Docket No. CV-0054), filed Jan. 22, 2004, entitled, "Hybrid Random Bead/Chip Based Microarray", U.S. Provisional Patent Applications Ser. Nos. 60/609,583, 60/610,059 and 60/609,712, all filed Sep. 13, 2004 (CV-0082PR, 83PR and 84PR); U.S. Provisional Patent Applications Ser. Nos. 60/611,205, 60/610,910, 60/610,833, 60/610,829, 60/610,928, all filed Sep. 17, 2004 (CV-0085PR, 86PR, 87PR, 88PR and 89PR); U.S. Provisional Patent Application Ser. No. 60/611,676, filed Sep. 20, 2004 (CV-0091PR); and U.S. patent applications Ser. No. 10/956,791, filed Oct. 1, 2004 (CV-0092 US).

Computer Programs and Other Data Processing Methods

Various aspects of the present invention may be conducted in an automated or semi-automated manner, generally with the assistance of well-known data processing methods. Computer programs and other data processing methods well known in the art may be used to store information including e.g. microbead identifiers, probe sequence information, sample information, and binding signal intensities. Data processing methods well known in the art may be used to read input data covering the desired characteristics.

Applications

The invention may be used in many areas such as drug discovery, functionalized substrates, biology, proteomics, combinatorial chemistry, DNA analysis/tracking/ sorting/ tagging, as well as tagging of molecules, biological particles, matrix support materials, immunoassays, receptor binding assays, scintillation proximity assays, radioactive or non-radioactive proximity assays, and other assays, (including fluorescent, mass spectroscopy), high throughput drug/genome screening, and/or massively parallel assay applications. The invention provides uniquely identifiable beads with reaction supports by active coatings for reaction tracking to perform multiplexed experiments.

Scope of the Invention

The dimensions and/or geometries for any of the embodiments described herein are merely for illustrative purposes and, as such, any other dimensions and/or geometries may be used if desired, depending on the application, size, performance, manufacturing requirements, or other factors, in view of the teachings herein.

It should be understood that, unless stated otherwise herein, any of the features, characteristics, alternatives or modifications described regarding a particular embodiment herein may also be applied, used, or incorporated with any other embodiment described herein. Also, the drawings herein are not drawn to scale.

Although the invention has been described and illustrated with respect to exemplary embodiments thereof, the foregoing and various other additions and omissions may be made therein and thereto without departing from the spirit and scope of the present invention.

Moreover, the invention comprises the features of construction, combination of elements, and arrangement of parts which will be exemplified in the construction hereinafter set forth.

It will thus be seen that the objects set forth above, and those made apparent from the preceding description, are efficiently attained and, since certain changes may be made in the above construction without departing from the scope of the invention, it is intended that all matter contained in the above description or shown in the accompanying drawing shall be interpreted as illustrative and not in a limiting sense.

I claim:

1. A method for fabricating an optical identification element comprising:
   providing a removable substrate having photosensitive material fabricated thereon;
   writing one or more gratings on the photosensitive material; and
   etching lines into the removable substrate to create one or more optical identification elements.

2. A method according to claim 1, wherein the optical identification element has a planar shape.

3. A method according to claim 1, wherein the optical identification element includes a holographic optical identification element.

4. A method according to claim 1, wherein the optical identification element has an interference pattern reproduced from a pattern of interference produced by a split coherent beam of radiation.

5. A method according to claim 1, wherein the writing one or more gratings includes exposing the photosensitive material to ultraviolet (UV) light.

6. A method according to claim 1, wherein the etching lines includes using photolithography to create the one or more optical identification elements.

7. A method according to claim 1 further comprising removing the optical identification elements from the substrate.

8. A method according to claim 1, wherein the one or more gratings include a surface relief grating, a densification grating, cover slips, or borosilcate.

9. A method according to claim 1, wherein the substrate includes an optical material.

10. A method according to claim 1, wherein the method includes writing grating codes at multiple axes across each optical identification element, where a single axis reader picks up one code.

11. A method according to claim 1, wherein the method includes adding an orientation marker to the optical identification element.

12. A method according to claim 11, wherein the orientation marker includes one or more of the following: a) magnetic material for self-alignment; b) birefringence; or c) fluorescence to determine alignment/orientation.

13. A method according to claim 1, wherein the method includes putting at least one bit in along different axes and using a spinning readout system.

* * * * *

UNITED STATES PATENT AND TRADEMARK OFFICE
CERTIFICATE OF CORRECTION

| | | |
|---|---|---|
| PATENT NO. | : 7,508,608 B2 | Page 1 of 1 |
| APPLICATION NO. | : 11/283518 | |
| DATED | : March 24, 2009 | |
| INVENTOR(S) | : Alan Kersey | |

It is certified that error appears in the above-identified patent and that said Letters Patent is hereby corrected as shown below:

Claim 8, column 6, line 32: delete "borosilcate." and insert -- borosilicate. --, therefor.

Signed and Sealed this

Fifteenth Day of June, 2010

David J. Kappos
*Director of the United States Patent and Trademark Office*